(12) United States Patent
Chu et al.

(10) Patent No.: US 9,520,467 B1
(45) Date of Patent: Dec. 13, 2016

(54) FIELD EFFECT TRANSISTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Fu-Yu Chu, Hsinchu (TW); Chih-Chang Cheng, Hsinchu (TW); Ruey-Hsin Liu, Hsin-Chu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/840,752

(22) Filed: Aug. 31, 2015

(51) Int. Cl.
| | | |
|---|---|---|
| H01L 21/338 | (2006.01) | |
| H01L 21/8236 | (2006.01) | |
| H01L 21/02 | (2006.01) | |
| H01L 29/10 | (2006.01) | |
| H01L 27/088 | (2006.01) | |
| H01L 29/78 | (2006.01) | |
| H01L 29/66 | (2006.01) | |

(52) U.S. Cl.
CPC ......... *H01L 29/1033* (2013.01); *H01L 27/088* (2013.01); *H01L 29/66492* (2013.01); *H01L 29/7833* (2013.01)

(58) Field of Classification Search
None
See application file for complete search history.

(56) References Cited

U.S. PATENT DOCUMENTS

| | | | | |
|---|---|---|---|---|
| 6,020,227 A | * | 2/2000 | Bulucea | H01L 21/823412 257/E21.427 |
| 6,596,598 B1 | * | 7/2003 | Krivokapic | H01L 21/26586 257/E21.205 |
| 2005/0082573 A1 | * | 4/2005 | Williford | H01L 21/26586 257/202 |
| 2014/0341497 A1 | * | 11/2014 | Liu | G02F 1/015 385/3 |

* cited by examiner

*Primary Examiner* — Calvin Choi
(74) *Attorney, Agent, or Firm* — WPAT, P.C., Intellectual Property Attorneys; Anthony King

(57) ABSTRACT

The present disclosure provides an FET structure including a substrate of a first conductive type having a top surface, a first gate over the top surface, a source and a drain of a second conductive type in the substrate, and a first channel under the first gate. A dopant concentration of a first conductive type includes double Gaussian peaks measured less than 200 nm beneath the top surface, from one end of the first gate to the other end of the first gate along the first channel. In some embodiments, the FET structure further including a second gate over the top surface and a second channel under the second gate. A dopant concentration of a first conductive type includes a single Gaussian peak measured less than 200 nm beneath the top surface, from one end of the second gate to the other end of the second gate along the second channel.

20 Claims, 15 Drawing Sheets

FIELD EFFECT TRANSISTOR STRUCTURE AND MANUFACTURING METHOD THEREOF

FIELD

The present disclosure relates to a channel implant profile of a field effect transistor (FET) structure and method of manufacturing the FET structure.

BACKGROUND

Two identical designed devices on an integrated circuit have random differences in their behavior and show a certain level of random mismatch in the parameters which model their behavior. This mismatch is due to the stochastic nature of physical processes that are used to fabricate the device.

The mismatch of two CMOS identical transistors is characterized by the random variation of the difference including their threshold voltage Vt. Threshold voltage generally means the lowest gate voltage required to permit current to pass from a source to a drain in an insulated gate field effect transistor (FET). Threshold voltage is thus the level of voltage required to turn the transistor on. Threshold voltage is important because if it is too low, it is possible to suffer off state leakage.

Off state leakage is leakage current that occurs when the transistor is turned off. If zero volts are placed on the gate of the transistor, nominally, the transistor should be off and zero current should flow. If the gate is at zero volts, there is no inversion region and there should be no current. The source and drain should be like two back-to-back diodes. There may be a small amount of diode leakage, of course, particularly where the source and the drain are close together. There may be a certain amount depletion region extending from the source and the drain towards each other, because the critical dimension of the transistor, i.e., the gate length is reduced. If these depletion regions overlap, they may create source to drain leakage. The merging of these depletion regions may be defeated by an implant strengthening the depletion region beneath the gate. One side effect of such an implant is to raise the voltage required to turn the gate on, or raise the threshold voltage of the transistor.

One of the ways to dope the region under the gate between the source and drain to defeat off state leakage is called a halo implant. The halo implant, as is well known in the art, is an implant that is typically directed at the surface of the integrated circuit at an angle a little off the normal. One reason for implanting the halo implant after formation of the transistor is that the critical dimension or gate length of the transistor operates as a control in the variables required to establish threshold voltage. The critical dimension or gate length of the FETs on an analog circuit may vary. However, even a slight variation can affect the threshold voltage boost required by the implant. A longer critical dimension or gate length transistor will need a lower threshold voltage boost because the gate itself is separating the source from the drain leaving a large region between the source and drain which reduces the probability of source drain overlap. A shorter critical dimension or gate length transistor will need a higher threshold voltage boost because the gate itself is separating the source from the drain leaving a short region between the source and drain which increases the probability of source drain overlap.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
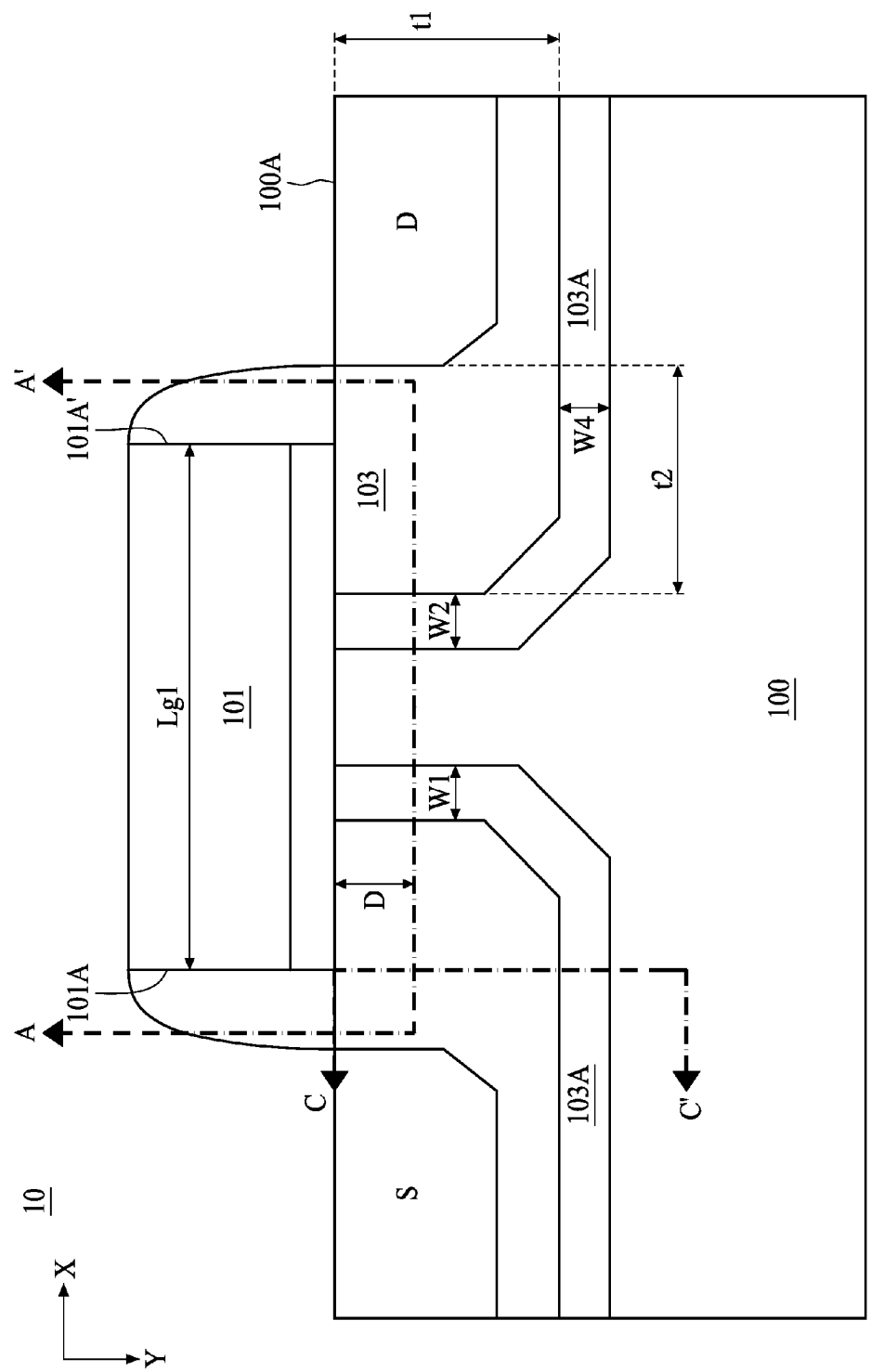
FIG. 1 is a cross sectional view of an FET structure having a first gate length, according to some embodiments of the present disclosure.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present invention. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combination of features that may exist alone or in other combinations of features; the scope of the invention being defined by the claims appended hereto.

In the drawings, like reference numbers are used to designate like or similar elements throughout the various views, and illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

In describing and claiming the present disclosure, the following terminology will be used in accordance with the definitions set forth below.

As used herein, "Gaussian distribution doping profile" refers to a doping concentration distribution either along (1) a direction perpendicular to the substrate surface following a Gaussian distribution profile or along (2) a direction parallel to the substrate surface following a Gaussian distribution profile. In some embodiments, the doping concentration distribution shows a portion of the Gaussian distribution curve.

As used herein, "monotonically decreasing doping profile" refers to a doping concentration decreases monotonically from the surface of the substrate to the bottom of the doped region.

As used herein, "Secondary ion mass spectrometry (SIMS)" refers to a technique used for surface composition analysis. SIMS probes the solid surface and thin films by sputtering the surface of the specimen with a focused primary ion beam and collecting and analyzing the ejected secondary ions. The mass/charge ratios of these secondary ions are measured with a mass spectrometer to determine the elemental, isotopic, or molecular composition of the surface to a depth hundreds of nanometers. SIMS is the most sensitive surface analysis technique, with elemental detection limits ranging from parts per million to parts per billion. In some embodiments of the present disclosure, SIMS analysis is conducted on a doped substrate in order to identify the doping profile in the direction perpendicular to the surface of the substrate. In some embodiments, SIMS analyzes a substrate surface to a depth of 1000 nanometers and the doping concentration is measured using a unit of atoms per centimeter cube.

As used herein, "vapor deposition" refers to process of depositing materials on a substrate using a vapor phase of a material to be deposited or a precursor of the material. Vapor deposition processes include any process such as, but not limited to, chemical vapor deposition (CVD) and physical vapor deposition (PVD). Examples of vapor deposition methods include hot filament CVD, rf-CVD, laser CVD (LCVD), conformal diamond coating processes, metal-organic CVD (MOCVD), sputtering, thermal evaporation PVD, ionized metal PVD (IMPVD), electron beam PVD (EBPVD), reactive PVD, atomic layer deposition (ALD), plasma enhanced CVD (PECVD), high density plasma CVD (HDPCVD), low pressure CVD (LPCVD), and the like.

As used herein, a "patterning" or "patterned" is used in the present disclosure to describe an operation of forming a predetermined pattern on a surface. The patterning operation includes various steps and processes and varies in accordance with features of embodiments. In some embodiments, a patterning operation patterns an existing film or layer. The patterning operation includes forming a mask on the existing film or layer and removing the unmasked portion of the film or layer with an etch or other removal process. The mask is a photo resist or a hardmask. In some embodiments, a patterning operation directly forms a patterned layer on a surface. The patterning operation includes forming a photosensitive film on the surface, conducting a photolithography process and a developing process. The remaining photosensitive film may be removed or retained and integrated into the package.

As used herein, "photoresist" refers to a general term including a positive photoresist and a negative photoresist. The image of the positive photoresist is the same as the image on the mask or reticle, and the image of negative photoresist is the reversed image of the mask or reticle. In some embodiments of the present disclosure, a positive photoresist is used to achieve sufficient resolution required for the submicron feature size.

Among all the mismatch qualities, threshold voltage (Vt) mismatch index is proportional to total doping atoms near a top surface (usually around 1 nm to 200 nm beneath of the top surface of the substrate). Vt mismatch is dominated by the number of activated doping atoms in the channel region. To elaborate, light channel doping concentration is the key to achieve good mismatch. Furthermore, less doping atoms implicate less trapping/de-trapping probability in the channel region, resulting in lower noise.

However, light channel doping suffers from low threshold voltage and thus high off-state leakage current, or so-called short channel effect. Along the dimension shrinkage of the device, the short channel effect becomes more serious. Since a shorter gate length transistor will need a higher threshold voltage boost, for the sake of manufacturing convenience, the longer gate length transistor on the same substrate will need to adapt the same implant dose of high threshold voltage boost, and to compromise the mismatch quality discussed above. Conventionally the Vt implant is a low energy, low dose implantation operation. The dopant profile of the Vt implant distributed in a planar and uniform fashion in proximity to (or in) the channel region of a transistor. For an analog circuit, differential pair and current mirror include various long gate length transistors, whereas normal logic circuit is mostly composed of short gate length transistors. To be more specific, when the dose of Vt implant for a short gate length transistor is scaled as unity, the dose of Vt implant for a long gate length transistor shall be scaled smaller than unity. However, under current analog circuit fabrication scheme where short gate length transistors and long gate length transistor are simultaneously implanted from a normal direction for Vt adjustment, the dose of Vt implant for the long gate length transistor is adapted to be the same as that in the short gate length transistor. As provided above, the threshold voltage (Vt) mismatch index is proportional to total doping atoms near a top surface or around the channel region. Excess dopants in the channel region in the long gate length transistor do no help to the off-state leakage current but generate a higher mismatch between long gate length transistors.

The present disclosure provides a new analog FET to realize different doping profiles depending on various channel lengths under a single manufacturing operation and achieve a better mismatch, noise, and current leakage performance.

Referring to FIG. 1, FIG. 1 is a cross sectional view of an FET structure 10 having a first gate length Lg1, according to some embodiments of the present disclosure. As shown in FIG. 1, a gate 101 is positioned on a substrate 100 of a first conductive type. The substrate 100 of the first conductive type has a top surface 100A supporting a bottom of the gate 101. In the present disclosure, the gate 101 is also called a "first gate" in accordance with the "first gate length Lg1" it possesses. A source S and a drain D defined by a dopant concentration profile, are located under the top surface 100A of the substrate 100. In some embodiments, the source S and the drain D are of second conductive type, which is opposite to the first conductive type of the substrate. A channel 103 is located under the gate 101 and between the source S and the drain D. In the present disclosure, the channel 103 is also called a "first channel" in accordance with the "first gate" under which it resides.

In the present embodiment, the substrate 100 is a p-type semiconductor substrate (P-Substrate) or an n-type semiconductor substrate (N-Substrate) comprising silicon. Alternatively, the substrate 100 comprises another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 100 is a semiconductor on insulator (SOI). In other alternatives, semiconductor substrate 100 may include a doped epi layer, a gradient semiconductor layer, and/or a semiconductor layer overlying another semiconductor layer of a different type, such as a silicon layer on a silicon germanium layer. The substrate 100 may or may not include doped regions, such as a p-well, an n-well, or combination thereof.

Figure 3:
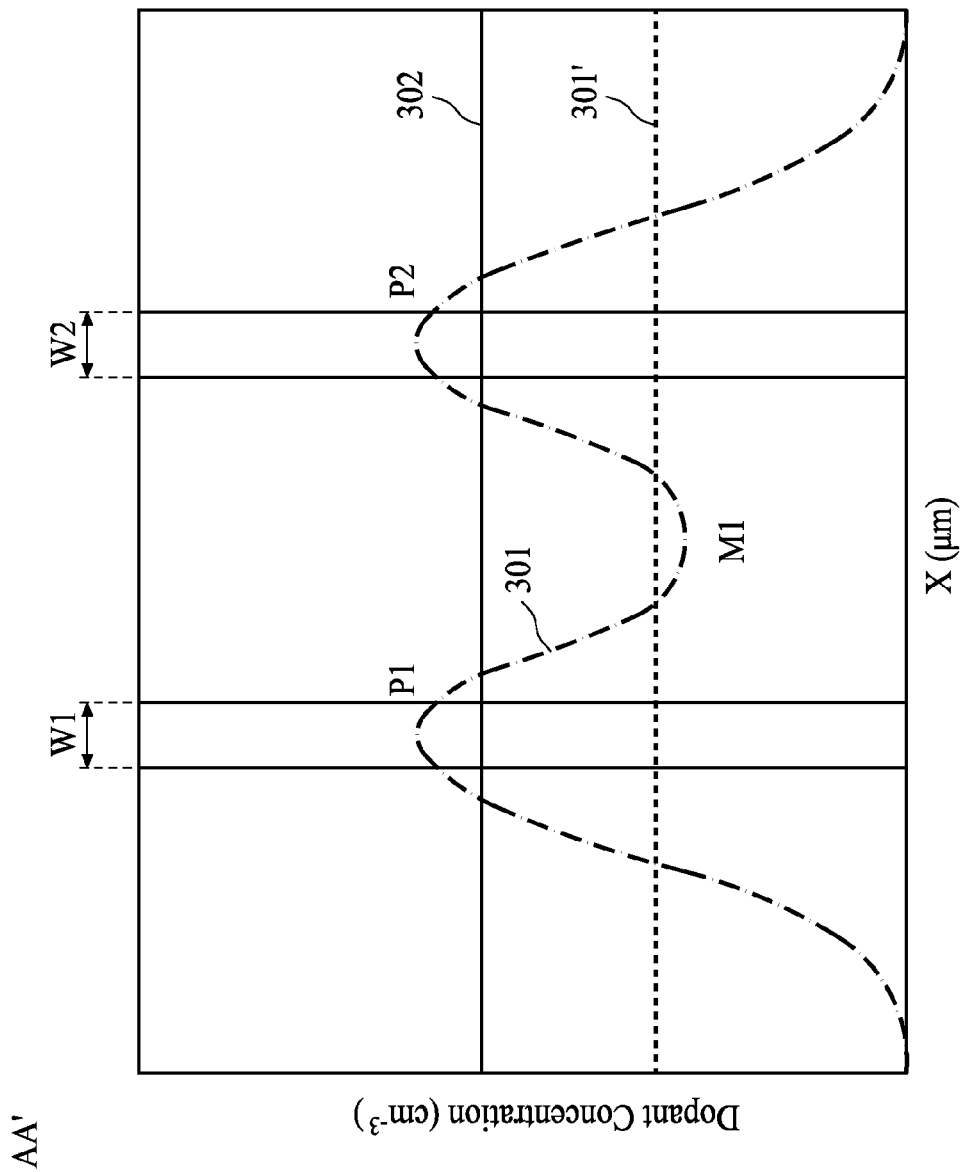
FIG. 3 is a normalized dopant concentration profile along a channel direction (X direction), according to some embodiments of the present disclosure.

A channel implant, or a Vt adjustment implant of the present disclosure shows a double Gaussian distribution doping profile of the first conductive type as shown in FIG. 3 and will be discussed later. In the present disclosure, the Gaussian distribution doping profile is called a Gaussian peak due to the fact that every Gaussian distribution doping profile can define a maximum doping concentration manifested as surface with various geometries in the substrate. In some embodiments, the doping concentration profile is mapped out by a SIMS characterization. In some embodiments, the double Gaussian peaks 103A are measured at a distance D under the top surface 100A, along a direction parallel to the first gate length Lg1. Alternatively stated, the double Gaussian peaks can be measured in the first channel 103 along a direction starting from one end 101A of the first gate 101 to the other end 101A' of the first gate 101 (i.e., in the X direction). In some embodiments, the distance D can be any number less than 200 nm.

FIG. 1 shows a planar MOSFET geometry. However, the present disclosure is not limited thereto. Any FET geometry having a channel implant (Vt adjustment implant) profile, such as a FinFET, can well adapt to the proposed double Gaussian implant profile described herein and is within the contemplated scope of the present disclosure.

Figure 2:
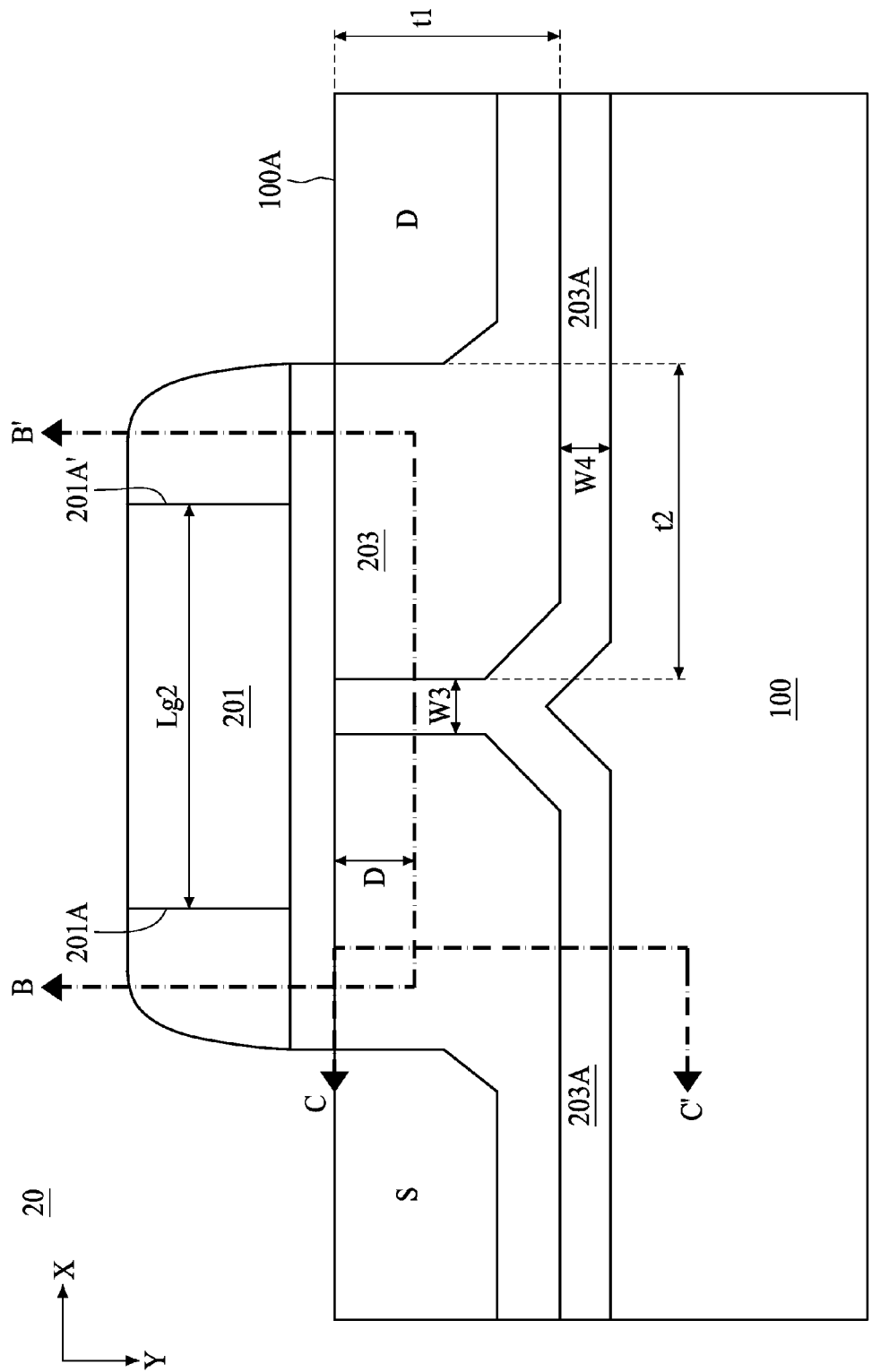
FIG. 2 is a cross sectional view of an FET structure having a second gate length, according to some embodiments of the present disclosure.

Referring to FIG. 2, FIG. 2 is a cross sectional view of an FET structure 20 having a second gate length Lg2, according to some embodiments of the present disclosure. As shown in FIG. 2, a gate 201 is positioned on a substrate 100 of a first conductive type. The substrate 100 of the first conductive type has a top surface 100A supporting a bottom of the gate 201. In the present disclosure, the gate 201 is also called a "second gate" in accordance with the "second gate length Lg2" it possesses. A source S and a drain D defined by a dopant concentration profile, are located under the top surface 100A of the substrate 100. In some embodiments, the source S and the drain D are of second conductive type, which is opposite to the first conductive type of the substrate. A channel 203 is located under the gate 201 and between the source S and the drain D. In the present disclosure, the channel 203 is also called a "second channel" in accordance with the "second gate" under which it resides.

Figure 4:
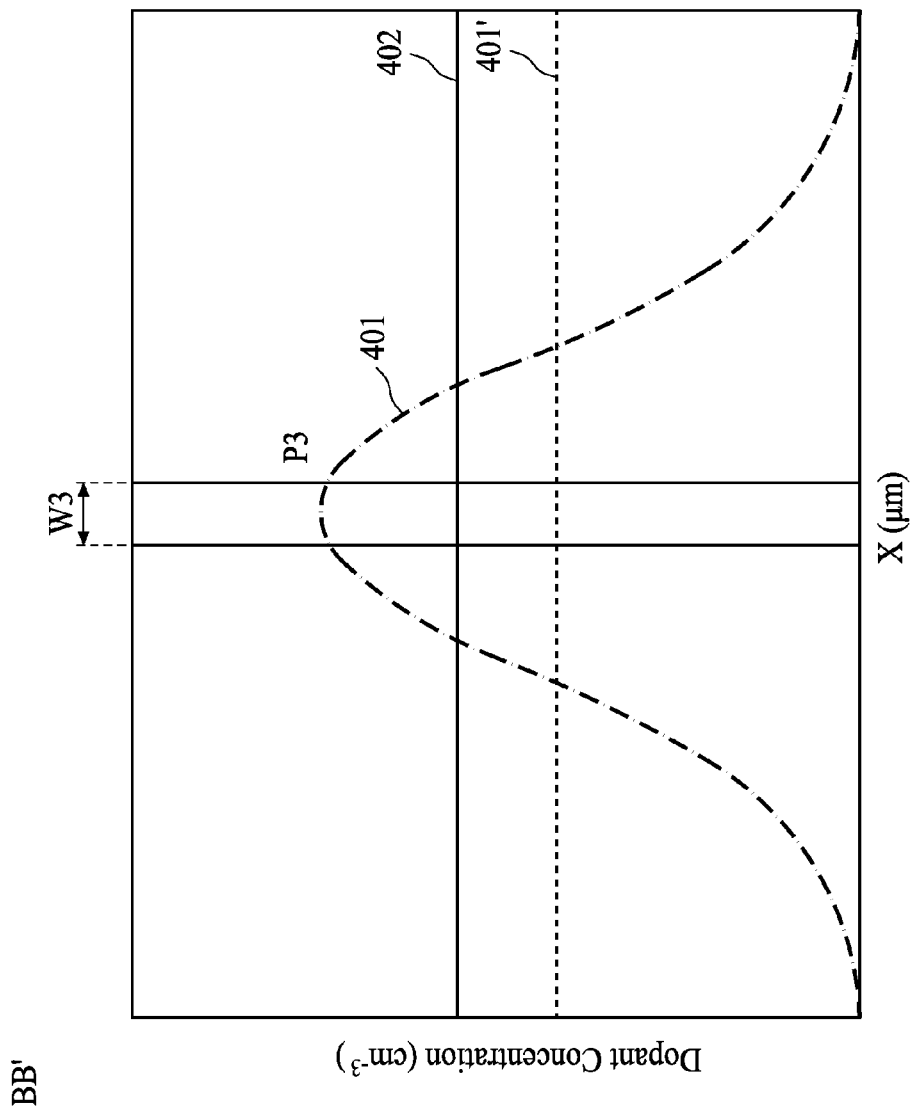
FIG. 4 is a normalized dopant concentration profile along a channel direction (X direction), according to some embodiments of the present disclosure.

A channel implant, or a Vt adjustment implant of the present disclosure shows a single Gaussian distribution doping profile of the first conductive type as shown in FIG. 4 and will be discussed later. In some embodiments, the single Gaussian peak is measured at a distance D under the top surface 100A, along a direction parallel to the second gate length Lg2. Alternatively stated, the single Gaussian peak 203A can be measured in the second channel 203 along a direction starting from one end 201A of the second gate 201 to the other end 201A' of the second gate 201 (i.e., in the X direction). In some embodiments, the distance D can be any number less than 200 nm. Note the substrate 100 under the first gate 101 and the second gate 201 is labeled 100. In some embodiments, the FET 10 and the FET 20 are manufactured on a same substrate. In some embodiments, the FET 10 and the FET 20 are components in an analog circuit. The FET 10 is located in a differential pair or a current mirror module, and the FET 20 is located in a logic module. In some embodiments, the first gate length Lg1 is greater than the second gate length Lg2.

Figure 5:
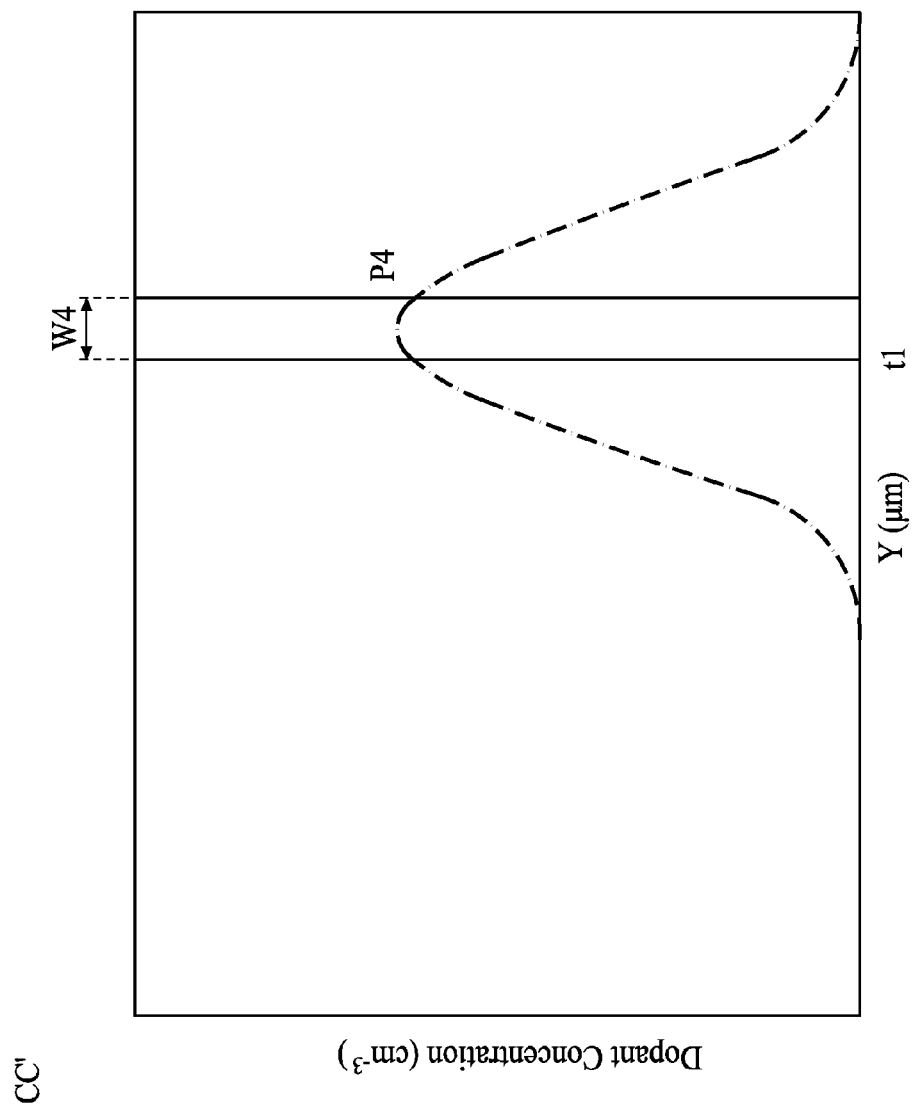
FIG. 5 is a normalized dopant concentration profile perpendicular to a channel direction (Y direction), according to some embodiments of the present disclosure.

Referring back to FIG. 1, when measured from a direction perpendicular to the first channel 103 starting from the top surface 103 toward the bottom of the substrate 100 (i.e., in the Y direction), a single Gaussian peak of the first conductive type as shown in FIG. 5 is shown and will be discussed later. In some embodiments, the single Gaussian peak 103A measured in the Y direction is located at a t1 distance under the top surface 100A of the substrate 100. In some embodiments, the t1 distance can be in a range of from about 0.01 μm to about 1 μm, according to suitable implant conditions. Also shown in FIG. 1, when measured from a border of the source S or the border of the drain D to one of the double Gaussian peaks that is closer to the source S or the drain D, respectively, a distance t2 can be defined. Similarly, the border of the source S or the border of the drain D can be identified by the SIMS characterization. In some embodiments, the border of a doped region is referred to a transition from a normal dopant concentration to a dopant concentration substantially lower than a predetermined value, for example, $1E16/cm^3$.

In some embodiments, a ratio of the distance t1 and distance t2 is in a range of from about 0.5 to about 1.5. The ratio of (t1/t2) is related to an implant angle applied. For example, when a 45 degrees implant angle is applied for the channel implantation, a ratio close to unity can be obtained. The implant angle referred herein is an angle between a top surface normal to a direction of the incident dopant ions. On the other hand, when a 30 degrees implant angle is applied, a ratio close to 0.5 can be obtained. In some embodiments, the implant angle for the single or double channel peaks implant profile is within a range of from about 30 degrees to about 45 degrees.

In some embodiments, the distance t2 is smaller than half of the first gate length Lg1 or the second gate length Lg2. For example, for an FET having an operation voltage of 5V, a second gate length Lg2 can be of 0.5 μm. The distance t2 in said FET can be smaller than 0.25 μm, or can be designed within a range of from about 0.2 μm to about 0.3 μm depending on shorter or a longer real gate length applied. For another example, for an FET having an operation voltage of 2.5V, a second gate length Lg2 can be of 0.25 μm. The distance t2 in said FET can be smaller than 0.125 μm, or can be designed within a range of from about 0.1 μm to about 0.15 μm depending on shorter or a longer real gate length applied. For still another example, for an FET having an operation voltage of 0.9V, a second gate length Lg2 can be of 0.05 μm. The distance t2 in said FET can be smaller than 0.025 μm, or can be designed within a range of from about 0.02 μm to about 0.03 μm depending on shorter or a longer real gate length applied.

Referring to FIG. 3, FIG. 3 is a normalized dopant concentration profile along line AA' of FIG. 1, according to some embodiments of the present disclosure. In FIG. 1 and FIG. 3, the first Gaussian peak P1 is closer to the source S, whereas the second Gaussian peak P2 is closer to the drain D. As discussed previously, the Gaussian peaks P1 and P2 refer to concentration distribution of a first conductive type dopant, identical to that of the conductive type of the substrate 100. In FIG. 1, a finite width W1 is shown in the Gaussian peak 103A. In some embodiments, the finite width W1 is defined as a narrow distribution of the dopant concentration from maximum concentration to 95% of the maximum concentration, as represented by the finite width W1 shown in FIG. 3. Similar analogy applies to the finite width W2 shown in FIG. 1 and FIG. 3.

An average concentration of the double Gaussian peaks profile 301 is shown by the dotted line 301'. Dopant concentration for a conventional channel implant demonstrates a uniform profile as represented by line 302. As shown in FIG. 3, an average dopant concentration in a conventional FET is greater than the average dopant concentration of the FET disclosed herein. In some embodiments, the maximum dopant concentration in the double Gaussian peaks profile is about $1E17/cm^3$ for an FET having an operation voltage about 5V. For an FET having an operation voltage lower than 5V, a slightly greater peak concentration can be designed. In some embodiments, a local minimum M1 dopant concentration in the double Gaussian peaks 301 is about $1E13/cm^3$ to about $1E16/cm^3$. In other words, one to two orders of magnitude difference exists between the double Gaussian peaks (P1, P2) and the local minimum M1 between the double Gaussian peaks (P1, P2).

Referring to FIG. 4, FIG. 4 is a normalized dopant concentration profile along line BB' of FIG. 2, according to some embodiments of the present disclosure. In FIG. 2 and FIG. 4, the single Gaussian peak P3 is approximately under a center position of the second gate 201. As discussed previously, the single Gaussian peak P3 refers to concentration distribution of a first conductive type dopant, identical to that of the conductive type of the substrate 100. In FIG. 2, a finite width W3 is shown in the Gaussian peak 203A. In some embodiments, the finite width W3 is defined as a narrow distribution of the dopant concentration from maximum concentration to 95% of the maximum concentration, as represented by the finite width W3 shown in FIG. 3. Comparing FIG. 3 and FIG. 4, in some embodiments, the single Gaussian peak P3 can be viewed as a superposition of the double Gaussian peaks (P1, P2).

An average concentration of the single Gaussian peak profile 401 is shown by the dotted line 401'. Dopant concentration for a conventional channel implant demonstrates a uniform profile as represented by line 402. As shown in FIG. 4, an average dopant concentration in a conventional FET is greater than the average dopant concentration of the FET disclosed herein. In some embodiments, the maximum dopant concentration in the double Gaussian peaks profile is about $1E17/cm^3$ for an FET having an operation voltage about 5V. For an FET having an operation voltage lower than 5V, a slightly greater peak concentration can be designed.

Comparing FIG. 3 and FIG. 4, in some embodiments, the average dopant concentration 301' of the double Gaussian peak profile 301 is lower than the average dopant concentration 401' of the single Gaussian peak profile 401. In some embodiments, since the total implant dose for the FET 10 and FET 20 are identical, and a first gate length Lg1 is greater than the second gate length Lg2, an average dopant concentration is greater in the FET 20 with the second (shorter) gate length Lg2. In some embodiments, the average dopant concentration 401' of the single Gaussian peak profile 401 is one to four orders of magnitude greater than the average dopant concentration 301' of the double Gaussian peak profile 301.

In other words, in a shorter gate length transistor, the threshold voltage can be tuned to a sufficiently high value to eliminate the short channel effect; whereas in a longer gate length transistor, in which the threshold voltage is not as sensitive, the threshold voltage can be tuned to a suitable value lower than that in a shorter channel transistor.

Referring to FIG. 5, FIG. 5 is a normalized dopant concentration profile along line CC' of FIG. 1 and FIG. 2, according to some embodiments of the present disclosure. In FIGS. 1, 2 and 5, the single Gaussian peak P4 is approximately at a distance t1 under the top surface 100A of the substrate 100. As discussed previously, the single Gaussian peak P4 refers to concentration distribution of a first conductive type dopant, identical to that of the conductive type of the substrate 100. In FIG. 5, a finite width W4 is shown in the Gaussian peak (103A, 203A). In some embodiments, the finite width W4 is defined as a narrow distribution of the dopant concentration from maximum concentration to 95% of the maximum concentration, as represented by the finite width W4 shown in FIG. 5.

Figure 6:
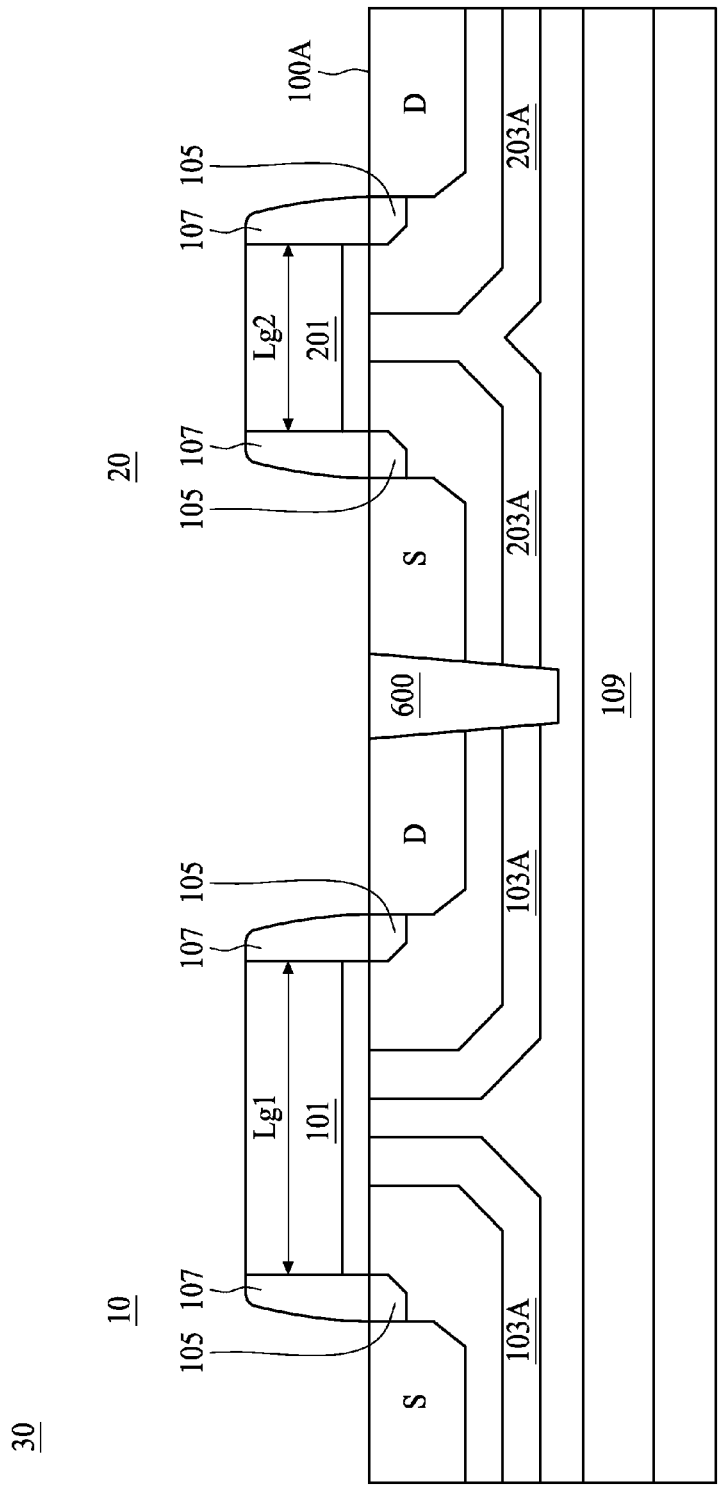
FIG. 6 is a cross sectional view of FET structures having a first gate length and a second gate length, according to some embodiments of the present disclosure.

Referring to FIG. 6, FIG. 6 is a cross sectional view of an FET structure 30 having a first gate length Lg1 and a second gate length Lg2, according to some embodiments of the present disclosure. In some embodiments, an analog circuit includes FETs with various gate lengths. Details regarding the FET 10 having a first gate length Lg1 and the FET 20 having a second gate length Lg2 are previously discussed and are omitted here for simplicity. In FIG. 6, a lightly doped drain (LDD) 105 of a second conductive type is positioned under a sidewall spacer 107 of the first gate 101 and a sidewall spacer 107 of the second gate 201. A shallow trench isolation 600 may be formed insulating the active region of FET 10 and FET 20. Although the double Gaussian peaks 103A possesses a peak dopant concentration at a distance t1 under the top surface 100A of the substrate 100 and at a distance t2 from a border of the source S or the border of the drain D to one of the double Gaussian peaks that is closer to the source S or the drain D, respective, the LDDs 105 shown in FIG. 6 have a monotonically decreasing doping profile starting from the top surface 100A of the substrate 100 toward the bottom of the LDD 105. The dopant concentration distribution difference between the single Gaussian peak 203A and the LDD 105 is similar to that between the double Gaussian peak 103A and the LDD 105 above.

In FIG. 6, an isolation implant 109 under the double Gaussian peaks 103A or the single Gaussian peak 203A channel implant is shown. The isolation implant deep under the substrate is configured to suppress leakage current from the active region of the FET to external circuit through the substrate 100.

Figure 7:
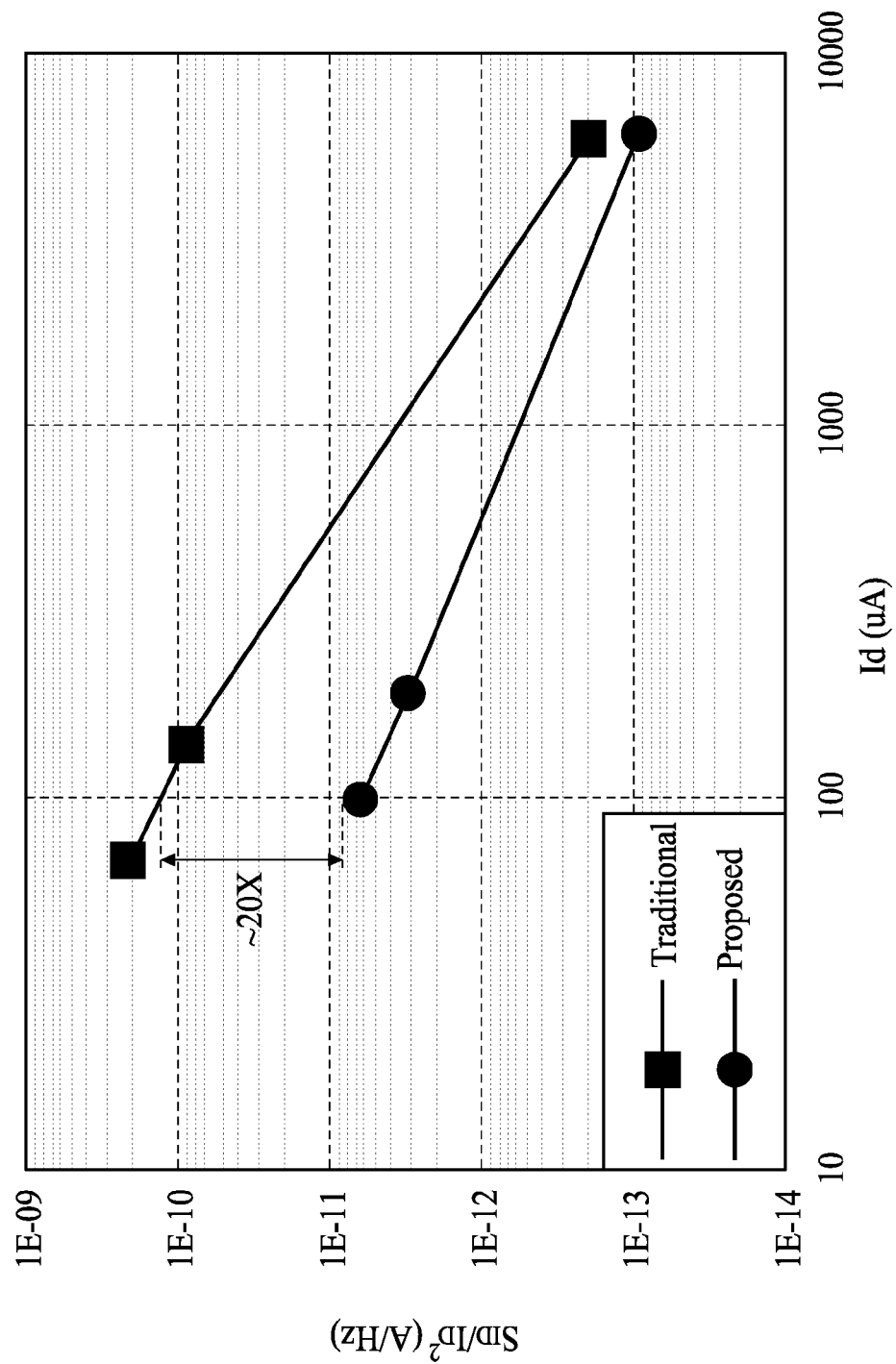
FIG. 7 is a diagram comparing drain current noise spectral density as a function of drain current under 100 Hz in a traditional analog FET and in an analog FET according to one embodiment of the present disclosure.

Referring to FIG. 7, FIG. 7 is a diagram comparing drain current noise spectral density as a function of drain current under 100 Hz in a traditional analog FET structure and in an analog FET structure, according to one embodiment of the present disclosure. The traditional analog FET structure herein is referred to FET structures having a uniform concentration channel implant as depicted by line 302 of FIG. 3 (in a longer gate length transistor) and line 402 of FIG. 4 (in a shorter gate length transistor). As shown in FIG. 7, under an overdrive drain current Id of about 100 µA, the noise spectral density of a traditional analog FET structure is about 20 times greater than that of the proposed analog FET structure. The noise reduction in the proposed analog FET structure herein is due to the fact that the average dopant concentration in the proposed analog FET structure in the channel is lower than that in the traditional analog FET structure, as depicted in FIG. 3 and FIG. 4. Low dopant concentration in the channel leads to lower carrier trapping/de-trapping behavior and consequently a lower device noise.

Figure 8:
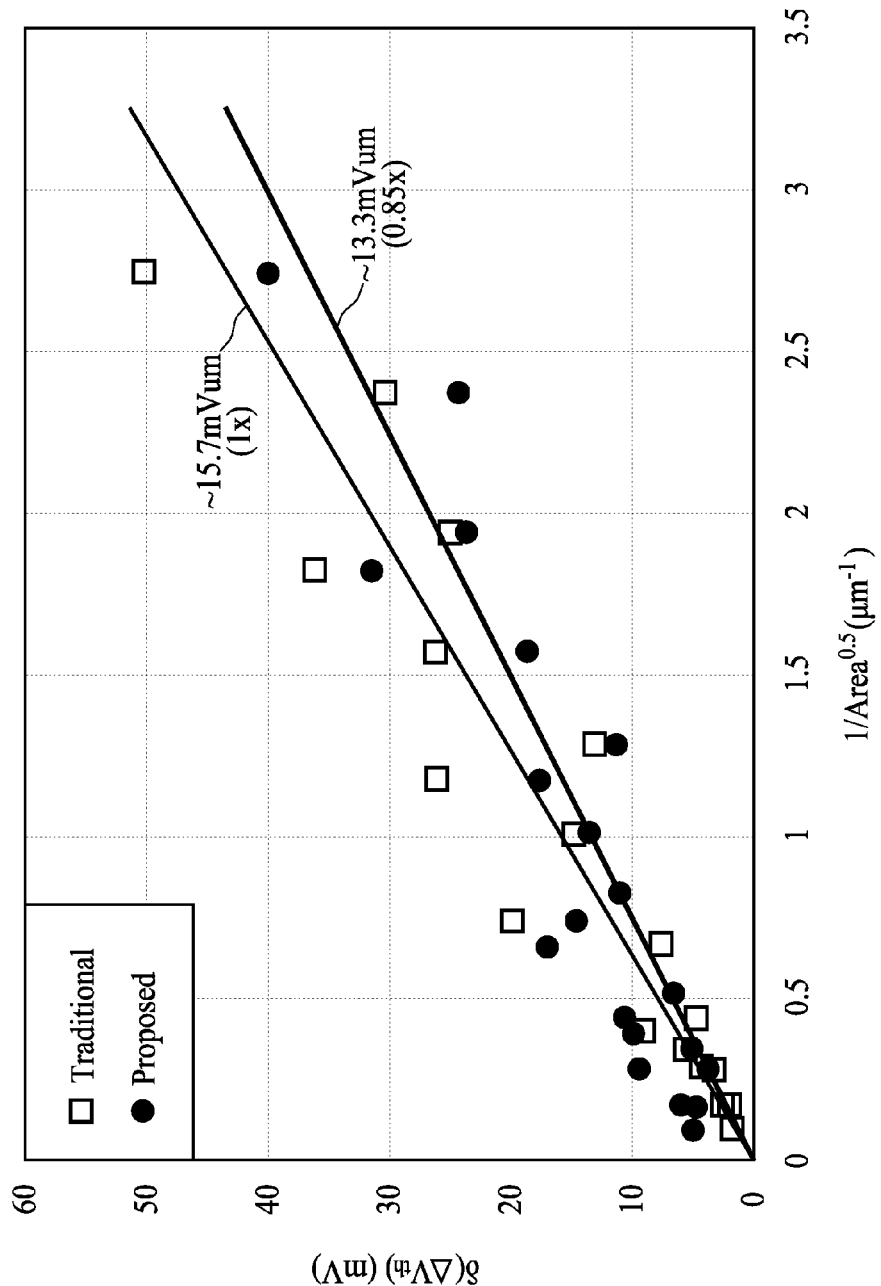
FIG. 8 is a diagram comparing threshold voltage mismatch performance as a function of device area in a traditional analog FET structure and in a proposed analog FET structure according to one embodiment of the present disclosure.

Referring to FIG. 8, FIG. 8 is a diagram comparing threshold voltage mismatch performance as a function of device area in a traditional analog FET structure and in a proposed analog FET structure, according to one embodiment of the present disclosure. The threshold voltage mismatch performance of an FET is characterized by the slope of the fitted lines of FIG. 8. The lines are fitted by data points showing a standard deviation of the threshold voltage mismatch as a function of the square root of the gate area. The greater the slope the more serious the threshold voltage mismatch among FETs. As shown in FIG. 8, the traditional analog FET structure possesses a slope of about 15.7 (mVµm) whereas the proposed analog FET structure possesses a slope of about 13.3 (mVµm). The proposed analog FET structure has a better threshold voltage mismatch performance than the traditional one in that the slope of the proposed structure (13.3) is about 0.85 time of the slope of the traditional structure (15.7). This result also indicates a gate area reduction because to reach an identical threshold voltage mismatch performance, the proposed analog FET structure can be designed to have a smaller gate area, or in turn, a shorter gate length.

Figure 9:
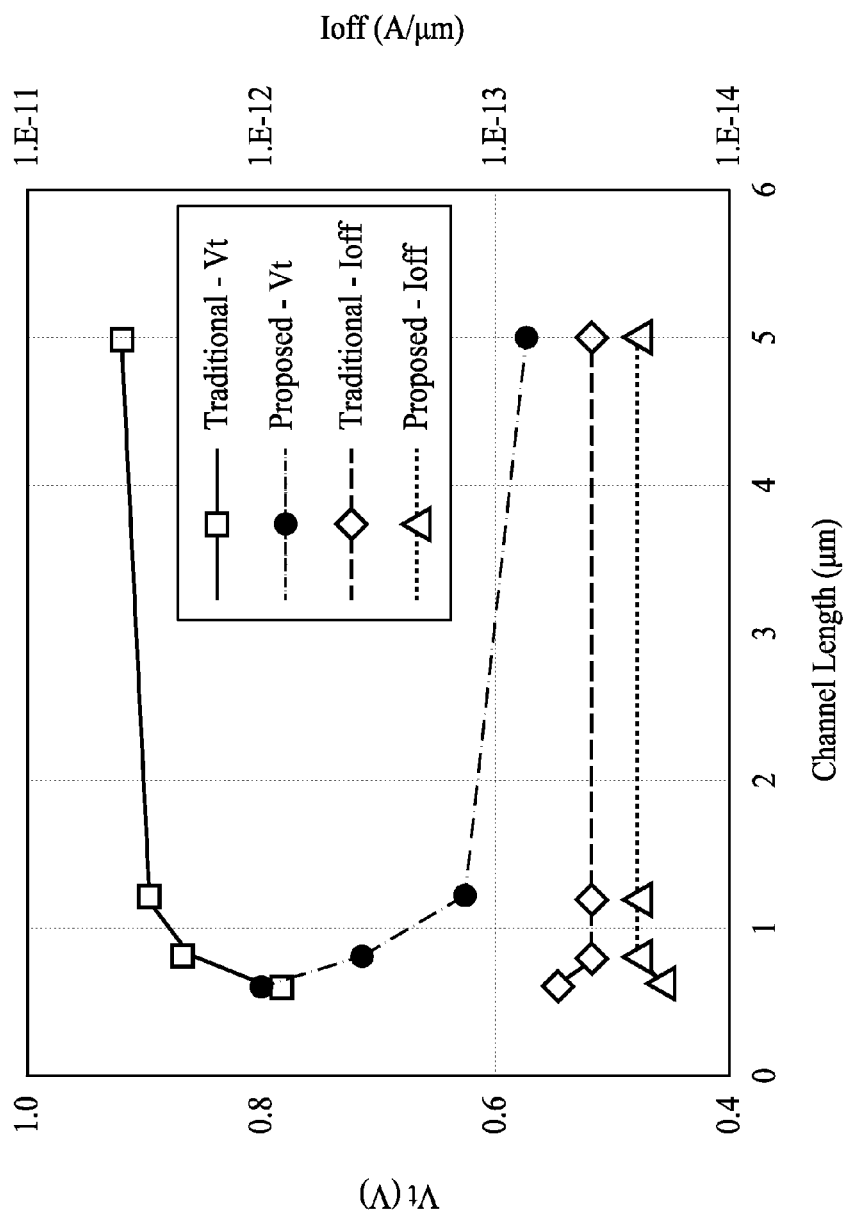
FIG. 9 is a diagram comparing the off current and the threshold voltage as a function of channel lengths in a traditional analog FET and in an analog FET according to one embodiment of the present disclosure.

Referring to FIG. 9, FIG. 9 is a diagram comparing the off current and the threshold voltage as a function of channel lengths in a traditional analog FET structure and in a proposed analog FET structure according to one embodiment of the present disclosure. A reverse short channel effect in the proposed analog FET structure can be observed. The reverse short channel effect occurs when a device having a shorter channel length demonstrating a higher Vt whereas a device having a longer channel length demonstrating a lower Vt, as shown in the proposed analog FET structure in FIG. 9. As opposed to the reverse short channel effect, the curve of the traditional analog FET structure in FIG. 9 shows a normal short channel effect. As shown by the curve demonstrating a reverse short channel effect, the long channel FET (for example, with a channel length of 5 µm) and the short channel FET (for example, with a channel length of 1 µm) possess a 200 mV threshold voltage difference.

Still referring to FIG. 9, a short channel proposed FET structure (for example, a channel length of 1 µm) close to a left end of the diagram shows sufficient threshold voltage (Vt) comparable to that of the traditional analog FET structure but having a lower off current than that of the traditional analog FET structure.

Figure 10:
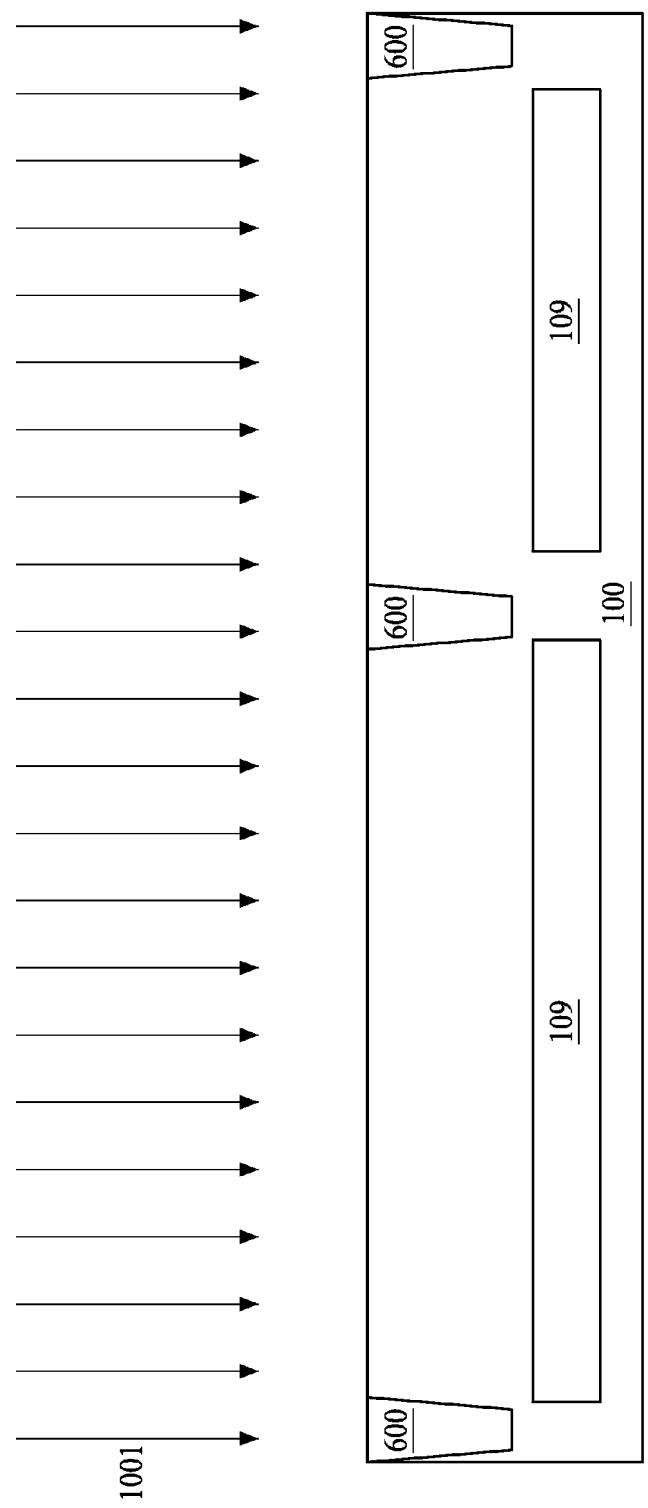
FIG. 10 to FIG. 15 show fragmental cross sectional views of the formation of an analog FET structure, according to some embodiments of the present disclosure.

FIG. 10 to FIG. 15 show fragmental cross sectional views of the formation of a proposed analog FET structure, according to some embodiments of the present disclosure. In FIG. 10, an isolation implant 1001 is conducted to form a leakage suppression layer in a substrate 100. Shallow trench isolation (STI) 600 is patterned and formed in the substrate, defining various active regions including FETs having different gate lengths. In some embodiments, the isolation implant 1001 forms a uniform dopant concentration profile of the first conductive type (same conductive type as the substrate) under the channel implant profile (not yet shown in FIG. 10). However, the isolation implant 1001 is an optional operation and can be omitted from the method disclosed herein.

Figure 11:
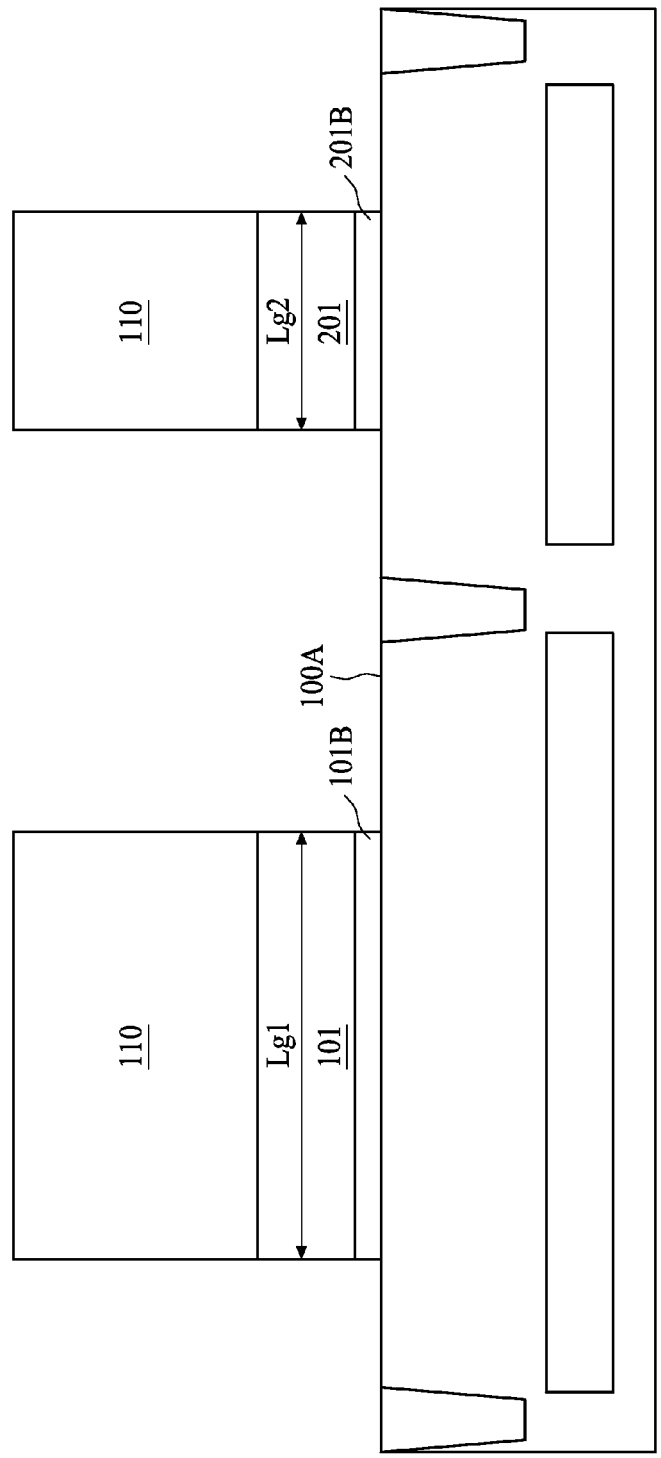

In FIG. 11, a first gate 101 having a gate length Lg1 and a second gate 201 having a gate length Lg2 are formed in respective FET region defined by the STI 600. In some embodiments, a gate oxide 101B, 201B is patterned along with the gate 101, 201 by photoresist 110.

Figure 12:
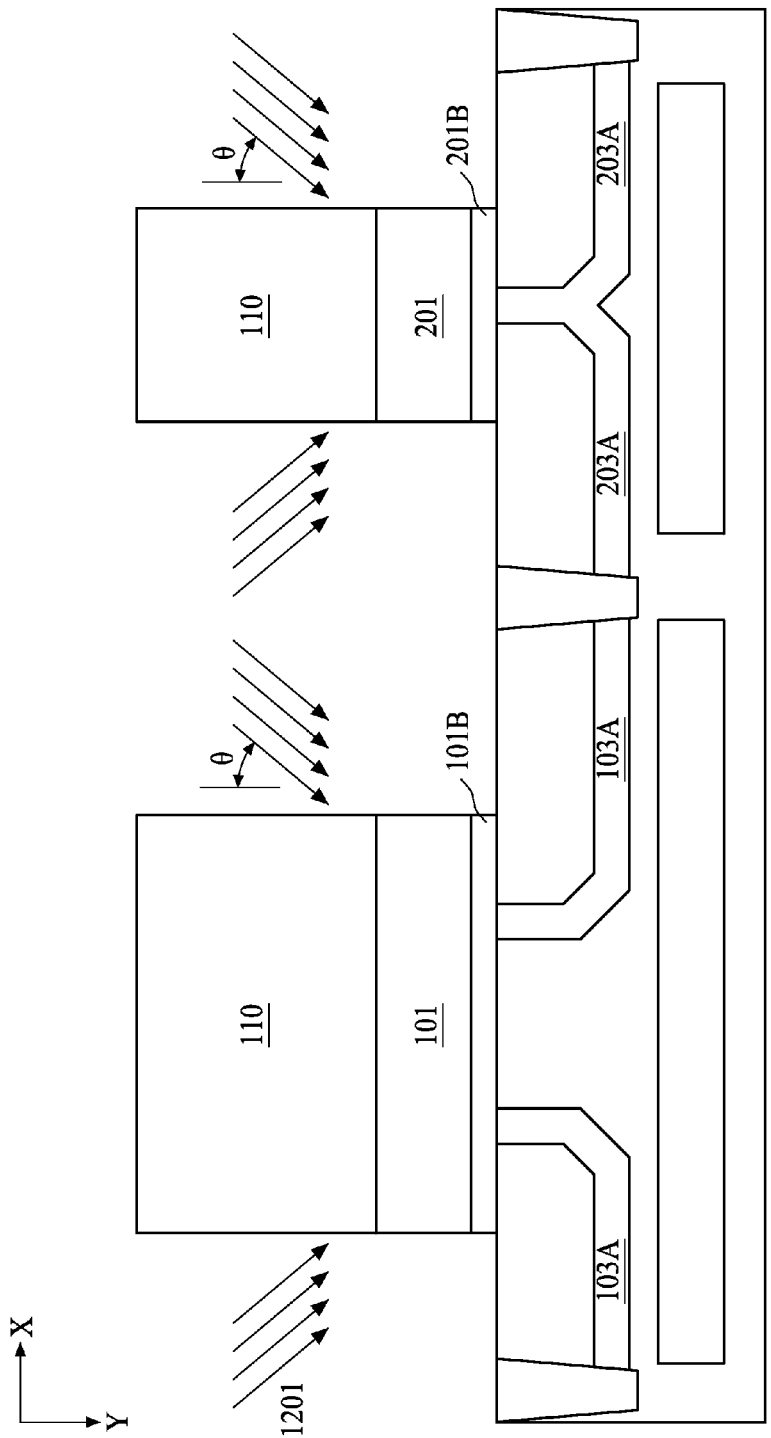

In FIG. 12, a channel implant 1201 is conducted at a tilting angle θ. In other words, the wafer under process is rotating during the implant operation. Hence, the consequent implant profile of the channel implant 1201 extends under the first gate 101 and the second 201. The profile forms a double Gaussian peaks 103A under the first gate 101 and a single Gaussian peak 203A under the second gate 201. Detail discussion regarding the double Gaussian peaks 103A and the single Gaussian peak 203A are previously discussed and is not repeated here for simplicity. In some embodiments, the tilting angle θ is tuned to be in a range of from about 30 degrees to about 45 degrees. The tilting angle θ is measured between the normal of the top surface 100A of the substrate 100 and the ion impinging direction. Same implant energy is applied to both the long channel FET and the short channel FET. For example, implant energy is chosen according to different operation voltage of the FETs and specific dopant species. For an FET operated under 0.9V, boron implant energy of 10 KeV is applied. For an FET operated under 2.5V, boron implant energy of 50 KeV is applied. For an FET operated under 5V, boron implant energy of 120 KeV is applied.

In some embodiments, single implant energy for the channel implant operation is applied. In other embodiments, more than single implant energy is adopted for the channel implant operation either simultaneously or in sequence so as to form a dopant concentration distribution of desired. Either using a single energy ion beam or a multi energy ion beam for the channel implant, the dopant concentration along line AA' of FIG. 1 shows a double Gaussian peaks as depicted in FIG. 3, and the dopant concentraion along line BB' of FIG. 2 shows a single Gaussian peak as depicted in FIG. 4.

Note a well implant in the substrate 100 can be omitted under the circumstance that the proposed channel implant is applied. As shown in FIG. 12, a double Gaussian peaks 103A have a vertical portion along the Y direction and a horizontal portion along the X direction. In some embodiments, the vertical portion in proximity to the gate oxide functions as a threshold voltage adjustment implant, and the horizontal portion functions as an antipunch through implant. In other embodiments, the vertical portion away from the gate oxide functions as a halo of pocket/deep pocket implant. Therefore, once double Gaussian peaks 103A and the single Gaussian peak 203A are formed according to the method disclosed herein, other implant operations may be omitted. For an identical operating voltage and dopant species, normally the implant energy and the tiling angle is further chosen according to the channel length. In some embodiments, the implant energy is chosen such that a distance t2 shown in FIG. 1 and FIG. 2 is smaller than one half of the channel length. Once the implant energy and tiling angle is determined, a t1 distance or a junction depth shown in FIG. 1 and FIG. 2 is determined.

Figure 13:
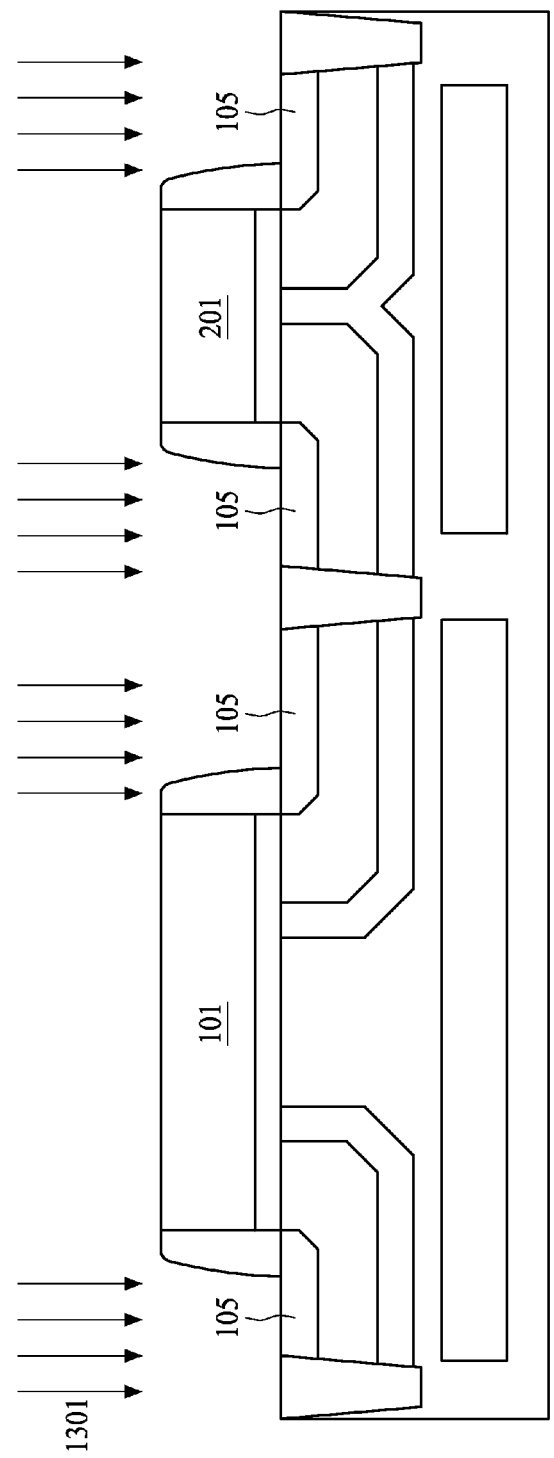
Figure 14:
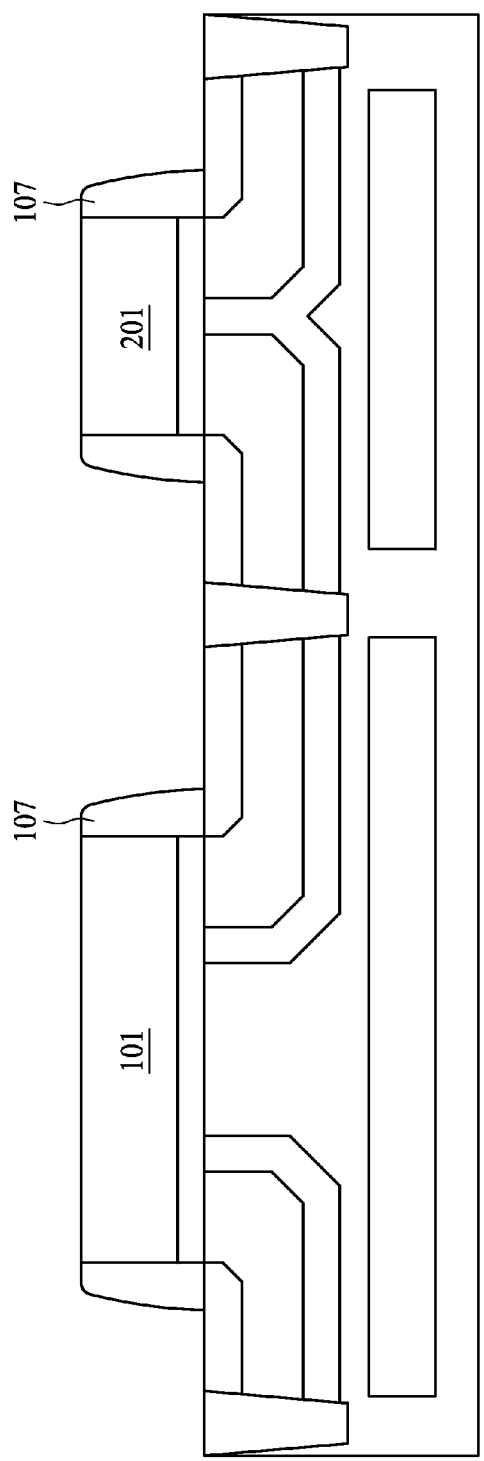
Figure 15:
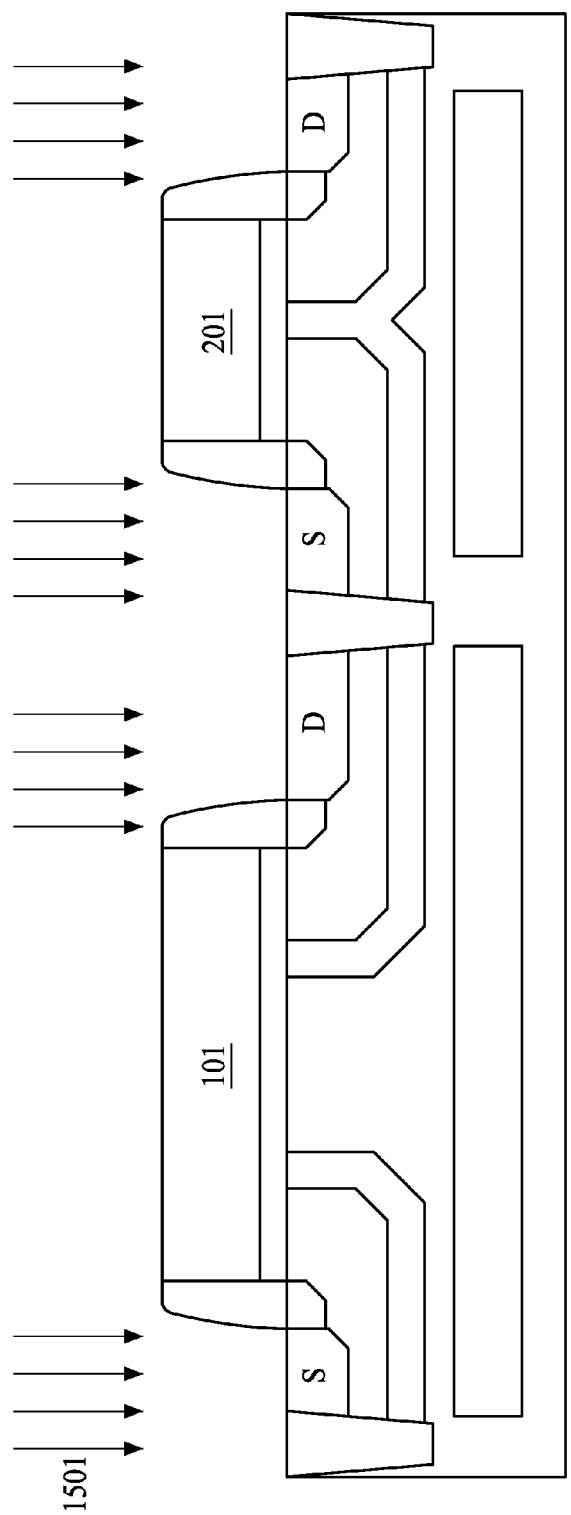

In FIG. 13, an LDD implant 1301 is conducted with a nearly zero tilting angle. In some embodiments, the LDD 105 shows a monotonically decreasing doping profile starting from the top surface 100A of the substrate 100 toward the bottom of the LDD 105. The first gate 101 and the second gate 201 are configured as a hard mask layer for the LDD 105 in under the top surface 100A of the substrate 100. In FIG. 14, a sidewall spacer 107 is formed through suitable operations surrounding the sidewalls of the first gate 101 and that of the second gate 201. The sidewall spacer formation is followed by a source and drain implant 1501, as shown in FIG. 15. In turn, the first and second gate (101, 201) and the sidewall spacer 107 are configured as a hard mask layer for the source S and drain D under the top surface 100A of the substrate 100.

The integrated circuit device may undergo further CMOS or MOS technology processing to form various features known in the art. For example, one or more contact features (not shown), such as silicide regions, may also be formed. The contact features may be coupled to the source and drain. The contact features comprise silicide materials, such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. In an example, the contact features are formed by a salicide (self-aligned silicide) process.

Subsequent processing may further include forming various contacts/vias/lines and multilayer interconnect features (e.g., metal layers and interlayer dielectrics) over the substrate, configured to connect the various features or structures of the integrated circuit device 200. The additional features may provide electrical interconnection to the device including the formed metal gate structures. For example, a multilayer interconnection includes vertical interconnects, such as conventional vias or contacts, and horizontal interconnects, such as metal lines. The various interconnection features may implement various conductive materials including copper, tungsten, and/or silicide. In one example a damascene and/or dual damascene process is used to form a copper related multilayer interconnection structure.

The present disclosure provides an FET structure including a substrate of a first conductive type having a top surface, a first gate over the top surface, a source and a drain of a second conductive type in the substrate, and a first channel under the first gate. A dopant concentration of a first conductive type includes double Gaussian peaks measured less than 200 nm beneath the top surface, from one end of the first gate to the other end of the first gate along the first channel.

The present disclosure provides an analog FET structure, including a substrate of a first conductive type having a top surface, a shorter gate over the top surface, a source and a drain of a second conductive type in the substrate, and a shorter channel under the first gate. A dopant concentration of a first conductive type includes a single Gaussian peak measured less than 200 nm beneath the top surface, from one end of the shorter gate to the other end of the shorter gate along the shorter channel.

The present disclosure provides a method for manufacturing an FET structure. The method includes forming a gate on a top surface of a substrate of a first conductive type, performing a channel implant at a tilting angle approximately from 30 degrees to 45 degrees so as to form a dopant concentration profile of the first conductive type having at least a single Gaussian peak measured less than 200 nm beneath the top surface, from one end of the gate to the other end of the gate along a channel under the gate, forming a sidewall spacer of the gate, and performing a source and a drain implant.

Although the present invention and its advantages have been described in detail, it should be understood that various changes, substitutions and alterations cancan be made herein without departing from the spirit and scope of the invention as defined by the appended claims. For example, many of the processes discussed above cancan be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An FET structure, comprising:
a substrate of a first conductive type having a top surface;
a first gate over the top surface;
a source and a drain of a second conductive type in the substrate; and
a first channel under the first gate,
wherein a dopant concentration of a first conductive type comprises double Gaussian peaks measured less than 200 nm beneath the top surface, from one end of the first gate to the other end of the first gate along the first channel.

2. The FET structure of claim 1, further comprising:
a second gate over the top surface; and
a second channel under the second gate;
wherein a dopant concentration of a first conductive type comprises a single Gaussian peak measured less than 200 nm beneath the top surface, from one end of the second gate to the other end of the second gate along the second channel.

3. The FET structure of claim 1, wherein a length of the first gate is greater than a length of the second gate.

4. The FET structure of claim 1, further comprising a single Gaussian peak of a dopant of the first conductive type at a t1 distance measured along a direction perpendicular to the first channel from the top surface into the substrate.

5. The FET structure of claim 4, further comprising a t2 distance measured from a border of the source or drain to one of the double Gaussian peaks closer to the source of drain, respectively, wherein a ratio t1/t2 is in a range of from about 0.5 to about 1.5.

6. The FET structure of claim 4, wherein a t1 distance is in a range of from about 0.01 µm to about 1 µm.

7. The FET structure of claim 1, further comprising a lightly doped drain (LDD) region of the second conductive type under a sidewall spacer of the first gate.

8. The FET structure of claim 1, wherein an average of the dopant concentration of the first conductive type measured less than 200 nm beneath the top surface, from one end of the first gate to the other end of the first gate along the first channel is less than an average of the dopant concentration of the first conductive type measured less than 200 nm beneath the top surface, from one end of the second gate to the other end of the second gate along the second channel.

9. An analog FET structure, comprising:
a substrate of a first conductive type having a top surface;
a shorter gate over the top surface;
a source and a drain of a second conductive type in the substrate; and
a shorter channel under the shorter gate,
wherein a dopant concentration of a first conductive type comprises a single Gaussian peak measured less than 200 nm beneath the top surface, from one end of the shorter gate to the other end of the shorter gate along the shorter channel.

10. The analog FET structure of claim 9, further comprising:
a longer gate over the top surface; and
a longer channel under the longer gate;
wherein a dopant concentration of a first conductive type comprises double Gaussian peaks measured less than 200 nm beneath the top surface, from one end of the longer gate to the other end of the longer gate along the longer channel.

11. The analog FET structure of claim 9, wherein the single Gaussian peak of the dopant concentration of the first conductive type is approximately $1E17/cm^3$.

12. The analog FET structure of claim 10, wherein a local minimum between the double Gaussian peaks of the dopant concentration of the first conductive type is approximately from $1E13/cm^3$ to about $1E16/cm^3$.

13. The analog FET structure of claim 9, wherein a border of the source or drain to the single Gaussian peak comprises a t2 distance along the shorter channel, the t2 distance is shorter than one half of a length of the shorter gate.

14. The analog FET structure of claim 9, further comprising a single Gaussian peak of a dopant of the first conductive type at a t1 distance measured along a direction perpendicular to the shorter channel from the top surface into the substrate, wherein a ratio t1/t2 is in a range of from about 0.5 to about 1.5.

15. The analog FET structure of claim 10, wherein an average of the dopant concentration of the first conductive type measured less than 200 nm beneath the top surface, from one end of the shorter gate to the other end of the shorter gate along the shorter channel is one to four order greater than an average of the dopant concentration of the first conductive type measured less than 200 nm beneath the top surface, from one end of the longer gate to the other end of the longer gate along the longer channel.

16. A method for manufacturing an FET structure, comprising:
forming a gate on a top surface of a substrate of a first conductive type;
performing a channel implant at a tilting angle approximately from 30 degrees to 45 degrees so as to form a dopant concentration profile of the first conductive type having at least a single Gaussian peak measured less than 200 nm beneath the top surface, from one end of the gate to the other end of the gate along a channel under the gate;
forming a sidewall spacer of the gate; and
performing a source and a drain implant.

17. The method of claim 16, further comprising:
performing an LDD implant at a zero tilting angle.

18. The method of claim 16, wherein the performing the channel implant at the tilting angle approximately from 30 degrees to 45 degrees comprises applying an implant energy of from about 10 KeV to about 120 KeV.

19. The method of claim 16, wherein the performing the channel implant at the tilting angle approximately from 30 degrees to 45 degrees comprises applying more than one implant operation at different implant energies.

20. The method of claim 16, further comprising applying an isolation implant prior to the channel implant so as to form a uniform dopant concentration profile of the first conductive type measured below the dopant concentration profile of the channel implant from one end of the gate to the other end of the gate along a direction of the channel.

* * * * *